United States Patent
Mori et al.

(10) Patent No.: US 9,518,320 B2
(45) Date of Patent: Dec. 13, 2016

(54) COPPER ALLOY SPUTTERING TARGET

(71) Applicant: MITSUBISHI MATERIALS CORPORATION, Tokyo (JP)

(72) Inventors: Satoru Mori, Okegawa (JP); Toshio Sakamoto, Kitamoto (JP); Kiyoyuki Ookubo, Iwaki (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 14/470,074

(22) Filed: Aug. 27, 2014

(65) Prior Publication Data
US 2015/0060269 A1    Mar. 5, 2015

(30) Foreign Application Priority Data

Aug. 30, 2013 (JP) .................. 2013-179386
Jul. 23, 2014 (JP) .................. 2014-149940

(51) Int. Cl.
C23C 14/34 (2006.01)
C22C 9/00 (2006.01)
H01J 37/34 (2006.01)
C22C 1/04 (2006.01)

(52) U.S. Cl.
CPC ......... *C23C 14/3414* (2013.01); *C22C 1/0425* (2013.01); *C22C 9/00* (2013.01); *H01J 37/3426* (2013.01)

(58) Field of Classification Search
CPC .................. C22C 1/0425; H01J 37/3426
See application file for complete search history.

(56) References Cited

U.S. PATENT DOCUMENTS

2008/0274369 A1* 11/2008 Lee ............... H01L 21/76843
                                              428/639

FOREIGN PATENT DOCUMENTS

| JP | 2009-215613 A | 9/2009 |
| JP | 2011-044674 A | 3/2011 |
| JP | 2013-014808 A | 1/2013 |

* cited by examiner

*Primary Examiner* — Jason M Berman
(74) *Attorney, Agent, or Firm* — Locke Lord LLP

(57) ABSTRACT

A copper alloy sputtering target is made of a copper alloy having a composition containing Ca in a range of 0.3 mass % to 1.7 mass % with a remainder of Cu and inevitable impurities, a Ca-segregated phase (10) in which Ca is segregated is dispersed in a matrix phase, and the Ca-segregated phase contains a Cu-dispersed phase (11) made of Cu.

1 Claim, 2 Drawing Sheets

ABSTRACT# COPPER ALLOY SPUTTERING TARGET

BACKGROUND OF THE INVENTION

Field of the Invention

The present invention relates to a copper alloy sputtering target.

Specifically, the present invention relates to a copper alloy sputtering target used as a target during sputtering when, for example, a copper alloy film serving as a wiring film such as a gate electrode, a source electrode, or a drain electrode in a thin film transistor is formed on a substrate made of glass, amorphous Si, silica, or the like through sputtering, and particularly to a sputtering target made of a Cu—Ca-based alloy (Ca-containing copper alloy).

Priority is claimed on Japanese Patent Application No. 2013-179386, filed on Aug. 30, 2013, and Japanese Patent Application No. 2014-149940, filed on Jul. 23, 2014 the content of which is incorporated herein by reference.

Description of Related Art

A flat panel display such as a liquid crystal display or an organic EL display has a structure in which a thin film transistor (hereinafter, expressed as "TFT") and a display circuit are formed on a glass substrate or the like. Meanwhile, the recent requirement for a large size and high definition flat panel television creates a demand for a large size and high definition display panel in which the above-described type of TFT is used (TFT panel).

In the past, a wiring film made of an aluminum (Al)-based material was generally used as a wiring film such as a gate electrode, a source electrode, a drain electrode, or the like in a large-size high-definition TFT panel; however, recently, to decrease the resistance of the wiring film, the use of a wiring film made of a copper (Cu)-based material having a higher conductivity than Al is advancing.

A variety of copper alloys have been proposed as the copper-based material used for a wiring film for the above-described TFT panel. In recent years, a Cu—Ca alloy has drawn attention as described in, for example, Japanese Unexamined Patent Application, First Publication No. 2009-215613 and Japanese Unexamined Patent Application, First Publication No. 2011-044674. A wiring film made of a Cu—Ca alloy does not only have a lower specific resistance than an Al-based material but also has excellent adhesiveness to glass or the like that is a substrate material. Meanwhile, in a case in which a wiring film of a TFT panel is formed using the above-described type of Cu—Ca alloy, it is normal to apply sputtering, and in this case, a sputtering target made of a Cu—Ca alloy is used. The above-described type of sputtering target is manufactured through, for example, steps of casting and hot rolling.

Meanwhile, there is a case in which abnormal discharge occurs during sputtering. Here, the term abnormal discharge refers to a phenomenon in which, compared with a normal current flowing during normal sputtering, an extremely large current abruptly flows, all of a sudden, and an abnormally large discharge occurs. When the abnormal discharge occurs, there is a concern that the film thickness of a deposited film formed through sputtering, which serves as a cause of particle generation, may become uneven. Therefore, it is desired to avoid abnormal discharge during sputtering as much as possible.

Therefore, Japanese Unexamined Patent Application, First Publication No. 2013-014808 discloses a target in which the average grain diameter of Cu—Ca-based crystals is regulated in a range of 10 μm to 50 μm to suppress the occurrence of abnormal discharge during the sputtering of a sputtering target made of a Cu—Ca alloy.

SUMMARY OF THE INVENTION

However, to decrease the price of a high-definition TFT panel, there is a strong demand for the improvement of productivity, and to further improve the productivity, the requirement for a high film-forming rate is becoming greater. An increase in the film-forming rate requires an increase in the power to be injected for sputtering; however, generally, when the power injected for sputtering is increased, abnormal discharge becomes more likely to occur, and therefore it becomes necessary to decrease the number of times abnormal discharge occurs.

Similarly, even in a case in which sputtering is carried out using a target made of a Cu—Ca alloy, it is required to further decrease abnormal discharge.

The present invention has been made in consideration of the above-described circumstances, and an object of the present invention is to provide a copper alloy sputtering target which is obtained using a Cu—Ca-based alloy produced by adding, as a main alloy element, Ca to Cu such as a Cu—Ca alloy, and is made to be capable of suppressing the occurrence of abnormal discharge even when sputtering is carried out with a larger power to increase the productivity by increasing the film-forming rate.

As a result of studies for solving the above-described problems, the present inventors clarified that, when a copper alloy sputtering target is manufactured, there is a case in which hot rolling causes cracking in Ca-segregated phases included in a Cu—Ca ingot, and particularly, when sputtering is carried out with a large current to increase the film-forming rate, the frequency of the abnormal discharge is increased due to the cracking, and more particles are generated. In addition, as a result of additional studies for solving the above-described problem, it was found that, when Cu-dispersed phases made of Cu are contained in the Ca-segregated phase, the occurrence of the above-described cracking is suppressed, and the occurrence of abnormal discharge can be suppressed during sputtering.

The present invention has been completed based on the above-described findings, and can be summarized as described below.

To solve the above-described problems, a copper alloy sputtering target of the present invention is made of a copper alloy having a composition containing Ca in a range of 0.3 mass % to 1.7 mass % with a remainder of Cu and inevitable impurities, in which Ca-segregated phases in which Ca is segregated are dispersed in a matrix phase (parent phase), and the Ca-segregated phase contains Cu-dispersed phases made of Cu.

According to the copper alloy sputtering target of the present invention, since the copper alloy sputtering target is made of a Cu—Ca-based copper alloy, the Ca-segregated phases in which Ca is segregated are dispersed in the matrix phase, and the Ca-segregated phase contains Cu-dispersed phases made of Cu, during hot rolling, the extension of cracks generated in the Ca-segregated phases is suppressed by the Cu-dispersed phases, and the cracking of the Ca-segregated phases can be suppressed. Therefore, even when the power to be injected during sputtering is increased, it becomes possible to suppress the occurrence of abnormal discharge during sputtering.

In addition, in the copper alloy sputtering target of the present invention, since a content of Ca is set to 0.3 mass % or more, it is possible to form a copper alloy film having favorable adhesiveness to a substrate made of glass, Si, silica, or the like through sputtering.

In addition, in the copper alloy sputtering target of the present invention, since the content of Ca is set to 1.7 mass % or less, it is possible to suppress the occurrence of cracking in a plate when a plate material is produced through hot rolling.

In addition, in the copper alloy sputtering target of the present invention, an average grain diameter of the Ca-segregated phases is preferably less than 10 µm.

In this case, since the average grain diameter of the Ca-segregated phases is set to less than 10 µm, it is possible to reliably suppress the occurrence of cracking in the Ca-segregated phases during hot rolling.

In addition, in the copper alloy sputtering target of the present invention, an average grain diameter of the Cu-dispersed phases is preferably set to 6 µm or less.

In this case, the average grain diameter of the Cu-dispersed phases is set to 6 µm or less, and therefore it is possible to suppress the extension of cracks generated in the Ca-segregated phases during hot rolling, and to reliably suppress the cracking of the Ca-segregated phases.

According to the present invention, it is possible to provide a copper alloy sputtering target which is obtained using a Cu—Ca-based alloy produced by adding, as a main alloy element, Ca to Cu such as a Cu—Ca alloy, and is made to be capable of suppressing the occurrence of abnormal discharge even when sputtering is carried out with a larger power to increase the productivity by increasing the film-forming rate.

DETAILED DESCRIPTION OF THE INVENTION

Hereinafter, an embodiment of the present invention will be described with reference to the accompanying drawings.

A copper alloy sputtering target according to the present embodiment has a composition containing Ca in a range of 0.3 mass % to 1.7 mass % with a remainder of Cu and inevitable impurities.

Figure 1:
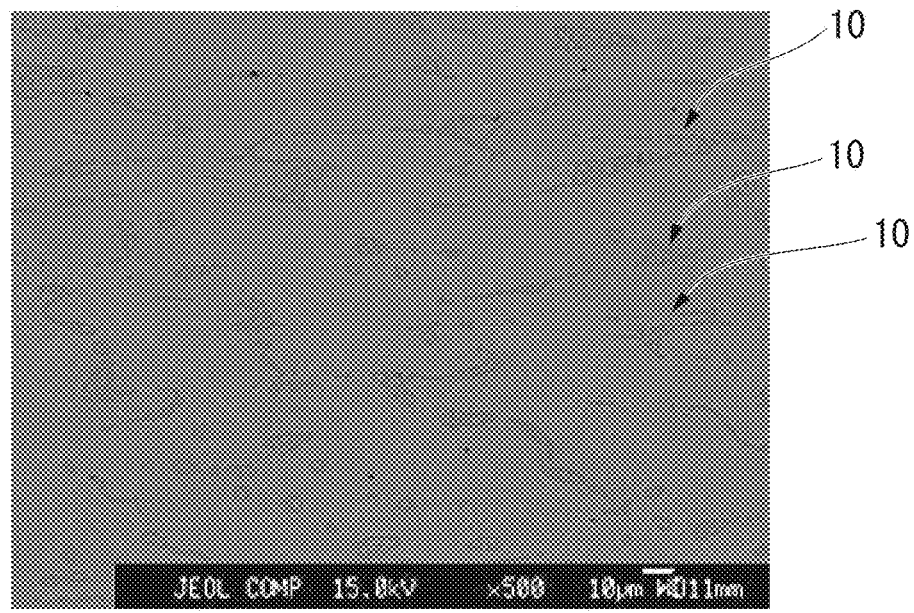
FIG. 1 is a COMPO image (magnification: 500 times) of an electron probe micro-analyzer (EPMA) for describing Ca-segregated phases after hot rolling in a sputtering target according to an embodiment of the present invention.
Figure 2:
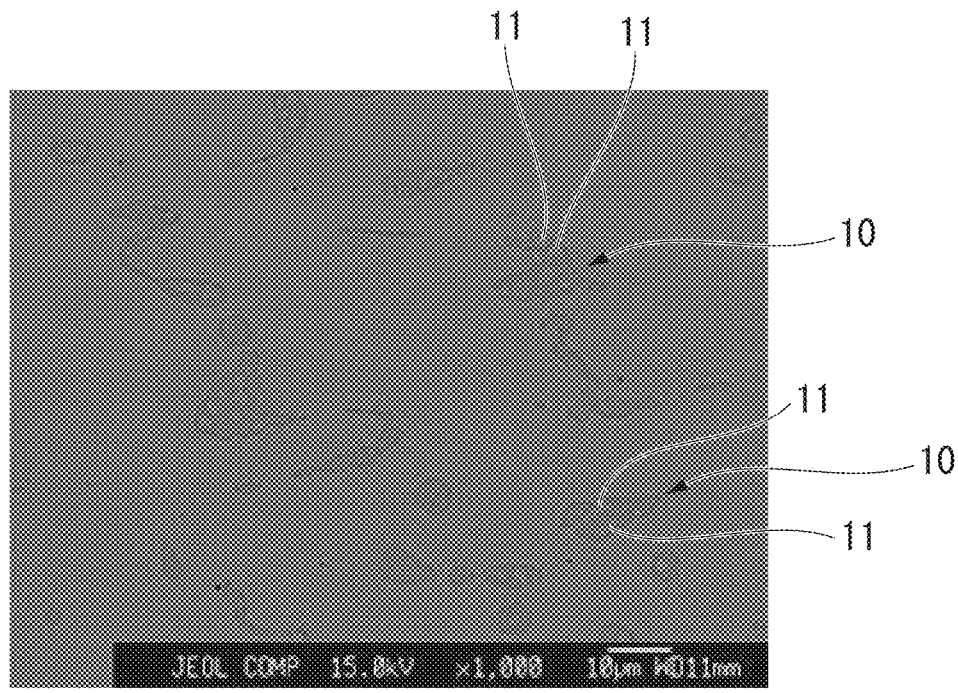
FIG. 2 is a COMPO image (magnification: 1000 times) of the electron probe micro-analyzer (EPMA) for describing Cu-dispersed phases after hot rolling in the sputtering target according to the embodiment of the present invention.
Figure 3:
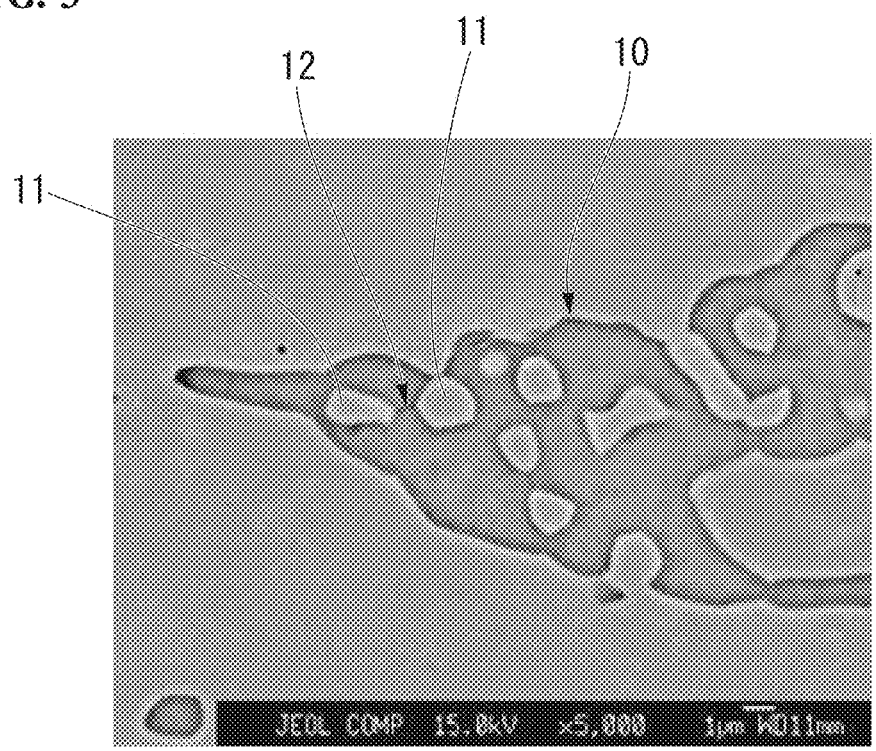
FIG. 3 is a COMPO image (magnification: 5000 times) of the electron probe micro-analyzer (EPMA) for describing cracks generated in the Ca-segregated phases after hot rolling in the sputtering target according to the embodiment of the present invention.

In addition, Ca-segregated phases 10 in which Ca is segregated are dispersed in a matrix phase of the copper alloy sputtering target as illustrated in FIGS. 1 to 3. The Ca-segregated phase 10 contains Cu-dispersed phases 11 made of Cu as illustrated in FIG. 2. Here, in the embodiment, the average grain diameter of the Ca-segregated phases 10 is preferably less than 10 µm, and the average grain diameter of the Cu-dispersed phases 11 is 6 µm or less.

Hereinafter, the reasons for regulating the composition in the above-described range and the reasons for regulating the metallographic structure as described above in the copper alloy sputtering target according to the embodiment will be described.

(Ca: 0.3 Mass % to 1.7 Mass %)

Ca is a basic alloy element of a Cu—Ca-based copper alloy that is the subject of the embodiment. A Cu—Ca-based copper alloy film obtained using the Cu—Ca-based copper alloy as a copper alloy sputtering target for the formation of a wire for a TFT panel exhibits a characteristic of a low specific resistance as a wiring layer. In addition, the Cu—Ca-based copper alloy film is excellent in terms of the adhesiveness to a substrate made of glass, Si, silica, or the like, and furthermore, depending on the sputtering conditions and the like, does not require a foundation layer made of expensive Mo, Ti, or the like, thereby enabling a decrease in the price of a TFT panel. In addition, for the wiring film made of the Cu—Ca-based copper alloy film, it is possible to prevent the degradation of the adhesiveness of the wiring film caused by a variety of thermal treatments that are generally applied in a process for producing a TFT panel.

Therefore, in the embodiment, the Cu—Ca-based alloy containing Ca is used as the copper alloy sputtering target used to form the above-described Cu—Ca-based copper alloy film on a substrate through sputtering. Here, when the Cu—Ca-based alloy for a target material has a Ca content of less than 0.3 mass %, the Ca content in the Cu—Ca-based alloy film that is formed on the substrate through sputtering becomes too small, and the above-described effect cannot be obtained. On the other hand, when the Cu—Ca-based alloy for the target material has a Ca content of more than 1.7 mass %, cracking becomes likely to occur when a plate material is produced through hot rolling, and consequently, cracking becomes likely to occur in the obtained sputtering target as well.

Therefore, the Ca content in the Cu—Ca-based alloy configuring the copper alloy sputtering target of the embodiment is set in a range of 0.3 mass % to 1.7 mass %.

The Ca content in the Cu—Ca-based alloy is preferably in a range of 0.4 mass % to 1.1 mass %, and more preferably in a range of 0.5 mass % to 0.7 mass %.

Examples of the inevitable impurities contained in the copper alloy sputtering target according to the embodiment include Mg, Al, Si, and the like.

(Ca-Segregated Phase: Less than 10 µm)

The Ca-segregated phase 10 is a phase generated due to the segregation of Ca during casting when an ingot for the copper alloy sputtering target is manufactured, and has a composition of, for example, $CuCa_3$. The ingot for the copper alloy sputtering target is, subsequently, processed to a target through hot rolling. In this hot-rolled copper alloy sputtering target material as well, the Ca-segregated phases 10 are dispersed in a matrix phase as illustrated in FIG. 1.

In a case in which the average grain diameter of the above-described Ca-segregated phases 10 is 10 µm or more, cracking becomes likely to occur in the Ca-segregated phases 10, and the frequency of the occurrence of abnormal discharge during sputtering is increased. For the above-described reason, in the embodiment, the average grain diameter of the Ca-segregated phases 10 is preferably less than 10 µm. Here, a more preferable average grain diameter of the Ca-segregated phases 10 is 5 µm or less.

The lower limit value of the average grain diameter of the Ca-segregated phases 10 is not particularly limited, but is preferably 2 µm or more, and more preferably 3 µm or more.

(Cu-Dispersed Phase: 6 µm or Less)

The Cu-dispersed phase 11 is a phase precipitated in the Ca-segregated phase 10 when the ingot for the copper alloy sputtering target is manufactured. The Cu-dispersed phases 11 are precipitated in the Ca-segregated phase 10 even after hot rolling, and specifically, the Cu-dispersed phases 11 are contained in the Ca-segregated phase 10 as illustrated in FIG. 2.

The Cu-dispersed phase 11 has an action of suppressing the extension of cracks 12 generated in the Ca-segregated phases 10 during hot rolling. For example, even when the cracks 12 are generated in the Ca-segregated phases 10 through hot rolling as illustrated in FIG. 3, it is possible to suppress the extension of the cracks 12 using the Cu-dispersed phases 11.

When the average grain diameter of the above-described Cu-dispersed phases 11 exceeds 6 μm, the Cu-dispersed phases 11 are not sufficiently dispersed in the Ca-segregated phase 10, and the effect that suppresses the extension of the cracks 12 generated in the Ca-segregated phase 10 degrades. For the above-described reason, in the embodiment, the average grain diameter of the Cu-dispersed phases 11 is preferably 6 μm or less. Here, a more preferable average grain diameter of the Cu-dispersed phases 11 is 3 μm or less.

The lower limit value of the average grain diameter of the Cu-dispersed phases 11 is not particularly limited, but is preferably 0.5 μm or more, and more preferably 1 μm or more.

Next, a method for manufacturing the copper alloy sputtering target according to the embodiment will be described.

Oxygen-free copper having a purity of 99.99 mass % or more is prepared, and the oxygen-free copper is dissolved at a high frequency in a high-purity graphite crucible under an inert gas atmosphere or a reducing gas atmosphere.

In addition, Ca having a purity of 98.5 mass % or more is added to and dissolved in the obtained molten metal so that the components are adjusted to make the molten metal have a predetermined component composition, and the molten metal is made to flow into a water cooling mold, thereby obtaining an ingot having a height of 120 mm, a width of 120 mm, and a plate thickness of 20 mm. In the embodiment, regarding the cooling rate of the ingot when the molten metal is made to flow into the water cooling mold, and the ingot is obtained, the average cooling rate from 1200° C. to 500° C. may be set to 50° C./second or more. Meanwhile, while there is no particular limitation, the upper limit value of the average cooling rate can be set to 90° C./second. The average cooling rate is preferably in a range of 60° C./second to 80° C./second.

Meanwhile, the dimensions of the ingot are not limited to the above-described dimensions, and can be set to a variety of dimensions.

Next, hot rolling is carried out on the ingot obtained in the above-described manner to a thickness in a range of 7 mm to 9 mm in a temperature range of 700° C. to 850° C., thereby obtaining a hot-rolled plate.

After the hot rolling, strain-relieving annealing is carried out on the above-described hot-rolled plate for one to four hours at a temperature in a range of 400° C. to 600° C.

Next, the hot-rolled plate that has been subjected to the strain-relieving annealing is turned to dimensions of an outer diameter of 152 mm and a thickness of 5 mm.

In the above-described manner, the copper alloy sputtering target according to the embodiment is manufactured.

The manufactured sputtering target is overlaid on a backing plate, and is joined using a method such as soldering, whereby a backing plate-attached sputtering target can be obtained.

According to the copper alloy sputtering target of the embodiment configured in the above-described manner, in the Cu—Ca-based alloy, the Ca-segregated phases 10 in which Ca is segregated are dispersed in the matrix phase, and the Ca-segregated phase 10 contains the Cu-dispersed phases 11 made of Cu, and therefore it is possible to suppress the cracking of the Ca-segregated phases 10 by suppressing the extension of the cracks 12 generated in the Ca-segregated phases 10 using the Cu-dispersed phases 11 during the hot rolling. Therefore, it becomes possible to suppress the occurrence of abnormal discharge during sputtering even when the power to be injected during sputtering is increased. For example, when the copper alloy sputtering target according to the embodiment is used, it is possible to suppress the occurrence of abnormal discharge and decrease the generation frequency of particles even in a case in which sputtering is carried out with a high power such as 1800 W.

Furthermore, in the copper alloy sputtering target according to the embodiment, the average grain diameter of the Ca-segregated phases 10 is set to less than 10 μm, and therefore it is possible to reliably suppress the occurrence of cracking in the Ca-segregated phases 10 during hot rolling.

In addition, in the copper alloy sputtering target according to the embodiment, the average grain diameter of the Cu-dispersed phases 11 is set to 6 μm or less, and therefore it is possible to suppress the extension of the cracks 12 generated in the Ca-segregated phases 10 during hot rolling, and to reliably suppress the cracking of the Ca-segregated phases 10.

In addition, the content of Ca in the copper alloy sputtering target according to the embodiment is set to 0.3 mass % or more, and therefore it is possible to form a copper alloy film having favorable adhesiveness to a substrate made of glass, Si, silica, or the like through sputtering.

In addition, the content of Ca in the copper alloy sputtering target according to the embodiment is set to 1.7 mass % or less, and therefore it is possible to suppress the occurrence of cracking in the plate when a plate material is produced through hot rolling.

In addition, according to the above-described method for manufacturing the copper alloy sputtering target, the molten metal is made to flow into the water cooling mold, and is cast, and therefore, the cooling rate is sufficiently fast, and it is possible to reliably obtain a metallographic structure in which the Cu-dispersed phases 11 are precipitated in the Ca-segregated phases 10.

In addition, in the embodiment, the cooling rate is set to 50° C./second or more in the method for manufacturing the copper alloy sputtering target, and therefore the Ca-segregated phases 10 and the Cu-dispersed phases 11 become fine, and it is possible to set the average grain diameter of the Ca-segregated phases 10 to less than 10 μm, and to set the average grain diameter of the Cu-dispersed phases 11 to 6 μm or less.

Thus far, the embodiment of the present invention has been described, but the present invention is not limited thereto, and can be appropriately modified within the technical concept of the present invention.

Meanwhile, in the embodiment, a case in which the average grain diameter of the Ca-segregated phases is less than 10 μm has been described, but the average grain diameter of the Ca-segregated phases is not limited thereto.

In addition, in the embodiment, a case in which the average grain diameter of the Cu-dispersed phases is 6 μm or less has been described, but the average grain diameter of the Cu-dispersed phases is not limited thereto.

In addition, in the embodiment, a case in which the cooling rate is 50° C./second or more when the ingot for the copper alloy sputtering target is manufactured has been described, but the cooling rate is not limited thereto.

EXAMPLES

Hereinafter, the results of a confirmatory experiment carried out to confirm the effectiveness of the present invention will be described.

Examples 1 to 8, Comparative Example 1

Oxygen-free copper having a purity of 99.99 mass % or more was prepared, and the oxygen-free copper was dissolved at a high frequency in a high-purity graphite crucible under an Ar gas atmosphere. Ca having a purity of 98.5 mass % or more was added to and dissolved in the obtained molten metal so that the components were adjusted to make the molten metal have a predetermined component composition described in Table 1. Next, the obtained molten metal was cast in a watercooling mold, and an ingot having a height of 120 mm, a width of 120 mm, and a plate thickness of 20 mm was obtained. At this time, regarding the cooling rate of the ingot, the average cooling rate from 1200° C. to 500° C. was set to 60° C./second.

Next, the ingot was hot-rolled to a plate thickness of 8 mm at 800° C., then, ultimately, strain-relieving annealing was carried out at 400° C., and the surface of the obtained hot-rolled material was turned, thereby producing a disc-shaped copper alloy sputtering target having dimensions of an outer diameter of 152 mm and a thickness of 5 mm.

In the above-described manner, copper alloy sputtering targets of Examples 1 to 8 and Comparative Example 1 were obtained. Meanwhile, in Comparative Example 1, cracking occurred in the plate during the hot rolling, and therefore the manufacturing was stopped.

Example 9 and 10, and Comparative Example 2

Copper alloy sputtering targets of Example 9 and 10, and Comparative Example 2 were manufactured in the same manner as the copper alloy sputtering targets of Examples 1 to 8 except for the fact that an ingot was obtained by making the molten metal flow into an ordinary mold that had not been water-cooled without using the watercooling mold during the casting.

For the copper alloy sputtering targets obtained in the above-described manner, the metallographic structures of the hot-rolled materials were observed, and the average grain diameters of the Ca-segregated phases and the Cu-dispersed phases were measured.

In addition, the obtained copper alloy sputtering target was overlaid on an oxygen-free copper backing plate, and was soldered using pure indium, thereby obtaining a backing plate-attached sputtering target. Sputtering was carried out using the baking plate-attached sputtering target, and the number of times of abnormal discharge was counted.

Hereinafter, the method for measuring the Ca-segregated phase and the Cu-dispersed phase, the sputtering method, and the method for counting the abnormal discharge will be described.

(Method for Measuring Ca-Segregated Phase and Cu-Dispersed Phase)

Samples were obtained from two places in the hot-rolled material that corresponded to the upper part and lower part of the ingot, the samples were polished, and metallographic structure photographs were taken using a scanning electron microscope.

The average grain diameter of the Ca-segregated phases was obtained by drawing five vertical lines and five horizontal lines on the metallographic structure photographs taken at a magnification of 500 times at certain intervals (30 μm to 45 μm), summing the lengths of the Ca-segregated phases intersecting the lines (180 μm to 230 μm), and dividing the summed length by the number of the Ca-segregated phases.

The average grain diameter of the Cu-dispersed phases was obtained by drawing ten vertical lines and ten horizontal lines on the metallographic structure photographs taken at a magnification of 1000 times at certain intervals (8 μm to 10 μm), summing the lengths of the Cu-dispersed phases intersecting the lines (90 μm to 110 μm), and dividing the summed length by the number of the Cu-dispersed phases. Meanwhile, the Ca-segregated phases and the Cu-dispersed phases were confirmed by carrying out the surface analyses of Cu and Ca using an electron probe microanalyzer.

(Sputtering Method and Abnormal Discharge Counting Method)

Sputtering was carried out using the above-described copper alloy sputtering targets. A direct-current method was employed as a power supply for a sputtering apparatus, and a vacuum container in the sputtering apparatus was vacuumed so that the final vacuum pressure reached $4 \times 10^{-5}$ Pa or less. Next, pure Ar gas or an oxygen-Ar gas mixture containing oxygen in a proportion of 10 vol % was made to flow into the vacuum container as a sputtering gas, the sputter atmosphere pressure was set to 0.67 Pa, discharge was carried out at an output of 600 W or 1800 W for eight hours, and the number of times of abnormal discharge occurring during the discharge was measured using an arc counter that is an adjunct of the power supply, thereby counting the total number of times of abnormal discharge.

The results of the above-described evaluations are described in Table 1.

TABLE 1

| | | Composition | | Cooling rate | Hot rolling | Average grain diameter | | Number of times of abnormal discharge (times/eight hours) | | | |
| | | | | | | Ca-segregated phase | Cu-dispersed phase | 600 W | | 1800 W | |
| | | Ca Mass % | Cu | °C./second | cracking | μm | | Pure Ar | Ar—O$_2$ | Pure Ar | Ar—O$_2$ |
|---|---|---|---|---|---|---|---|---|---|---|---|
| Example | 1 | 0.3 | Remainder | 60 | No | 1.3 | 0.8 | 0 | 0 | 0 | 0 |
| | 2 | 0.5 | Remainder | 60 | No | 1.9 | 1.0 | 0 | 0 | 0 | 0 |
| | 3 | 0.6 | Remainder | 60 | No | 2.5 | 1.7 | 0 | 0 | 0 | 0 |
| | 4 | 0.7 | Remainder | 60 | No | 3.4 | 2.5 | 0 | 0 | 0 | 0 |
| | 5 | 0.8 | Remainder | 60 | No | 3.8 | 1.6 | 0 | 0 | 0 | 0 |

TABLE 1-continued

| | | Composition Ca Mass % | Cu | Cooling rate ° C./second | Hot rolling cracking | Average grain diameter | | Number of times of abnormal discharge (times/eight hours) | | | |
|---|---|---|---|---|---|---|---|---|---|---|---|
| | | | | | | Ca-segregated phase | Cu-dispersed phase | 600 W | | 1800 W | |
| | | | | | | μm | | Pure Ar | Ar—O₂ | Pure Ar | Ar—O₂ |
| | 6 | 1.2 | Remainder | 60 | No | 7.0 | 1.4 | 0 | 0 | 0 | 0 |
| | 7 | 1.3 | Remainder | 60 | No | 6.6 | 1.2 | 0 | 0 | 0 | 0 |
| | 8 | 1.7 | Remainder | 60 | No | 9.0 | 5.5 | 0 | 0 | 0 | 0 |
| | 9 | 0.7 | Remainder | 10 | No | 20.2 | 10.0 | 0 | 0 | 7 | 8 |
| | 10 | 1.5 | Remainder | 10 | No | 25.3 | 8.0 | 0 | 0 | 5 | 3 |
| Comparative | 1 | 2.1 | Remainder | 60 | Yes | — | — | — | — | — | — |
| Example | 2 | 0.4 | Remainder | 10 | No | 5.5 | None | 0 | 0 | 45 | 55 |

As described in Table 1, it was confirmed that, in the copper alloy sputtering targets of Examples 1 to 10, the numbers of times of abnormal discharge were small. Particularly, in the copper alloy sputtering targets of Examples 1 to 8, the average grain diameter of the Ca-segregated phase was set to less than 10 μm, the average grain diameter of the Cu-dispersed phase was set to 6 μm or less, and no abnormal discharge occurred even in a case in which sputtering was carried out at an output of 1800 W for eight hours.

On the other hand, in Comparative Example 1, since the content of Ca was greater than that of the present invention, cracking occurred during hot rolling, and it was not possible to manufacture a copper alloy sputtering target.

In addition, in the copper alloy sputtering target of Comparative Example 2, since the content of Ca was relatively small, and furthermore, the ingot was cast at a cooling rate of 10° C./second, there were no Cu-dispersed phases in the Ca-segregated phase, it was not possible to suppress the extension of cracks generated in the Ca-segregated phase during the hot rolling, cracking occurred in the Ca-segregated phase, and the number of times of abnormal discharge increased in a case in which sputtering was carried out at 1800 W for eight hours.

What is claimed is:

1. A copper alloy sputtering target made of a copper alloy having a composition comprising Ca in a range of 0.3 mass % to 1.7 mass % with a remainder of Cu and inevitable impurities,
    wherein Ca-segregated phases in which Ca is segregated are dispersed in a matrix phase,
    the Ca-segregated phase contains Cu-dispersed phases made of Cu,
    an average grain diameter of the Ca-segregated phases is less than 10 μm, and
    an average grain diameter of the Cu-dispersed phases is set to 6 μm or less.

* * * * *